United States Patent
Liao et al.

(10) Patent No.: US 8,963,123 B2
(45) Date of Patent: Feb. 24, 2015

(54) LIGHT EMITTING DIODE WITH ENHANCED LIGHT EXTRACTION

(71) Applicant: Formosa Epitaxy Incorporation, Tao-Yuan Hsien (TW)

(72) Inventors: Keng-Ying Liao, Tao-Yuan Hsien (TW); Yu-Hsuan Liu, Tao-Yuan Hsien (TW)

(73) Assignee: Formosa Epitaxy Incorporation, Lung-Tan IND. Park, Lung-Tan, Tao-Yuan Hsien (TW)

( * ) Notice: Subject to any disclaimer, the term of this patent is extended or adjusted under 35 U.S.C. 154(b) by 0 days.

(21) Appl. No.: 14/016,236

(22) Filed: Sep. 3, 2013

(65) Prior Publication Data

US 2014/0175485 A1  Jun. 26, 2014

Related U.S. Application Data

(60) Provisional application No. 61/745,822, filed on Dec. 26, 2012.

(51) Int. Cl.
*H01L 29/06* (2006.01)
*H01L 33/44* (2010.01)
*H01L 33/38* (2010.01)

(52) U.S. Cl.
CPC ............... *H01L 33/44* (2013.01); *H01L 33/38* (2013.01)
USPC ........ 257/14; 257/184; 257/295; 257/E33.025

(58) Field of Classification Search
CPC .. H01L 25/048; H01L 27/288; H01L 27/3227
USPC ............................. 257/295, 14, 184, E33.025
See application file for complete search history.

(56) References Cited

U.S. PATENT DOCUMENTS

2010/0290247 A1* 11/2010 Im .................................. 362/606

\* cited by examiner

*Primary Examiner* — Elias M Ullah
(74) *Attorney, Agent, or Firm* — Winston Hsu; Scott Margo

(57) ABSTRACT

A light-emitting diode includes a substrate, a stacked semiconductor structure on one side of the substrate, and a reflection layer on the other side of the substrate opposite to the stacked semiconductor structure. At least one contact electrode is disposed on the stacked semiconductor structure. The contact electrode includes a pad electrode and at least one finger electrode extending from the pad electrode. A light-guiding structure is disposed along the finger electrode.

19 Claims, 5 Drawing Sheets

LIGHT EMITTING DIODE WITH ENHANCED LIGHT EXTRACTION

CROSS REFERENCE TO RELATED APPLICATIONS

This application claims the benefit of provisional application No. 61/745,822 filed Dec. 26, 2012.

BACKGROUND OF THE INVENTION

1. Field of the Invention

The present invention relates generally to the field of light emitting diode (LED) devices. More specifically, it relates to an improved electrode structure of LED devices, which are capable of enhancing light extraction.

2. Description of the Prior Art

As known in the art, light emitting diodes (LEDs) are solid-state semiconductor devices that convert electric energy to light. Improvements in these devices have resulted in their use in light fixtures designed to replace conventional incandescent and fluorescent light sources. The LEDs have significantly longer lifetimes and high efficiency for converting electric energy to light.

An LED generally comprises an active layer of semiconductor material sandwiched between p-type and n-type doped layers. A drive current is applied across electrical contacts on the doped layers causing electrons and holes to be injected from the doped layers into the active layer. The electrons and holes then recombine to generate light that emits omnidirectionlly from the active layer and escapes from surfaces of the LED.

When an LED is energized, light emitting from its active layer reaches the emitting surfaces at many different angles. Typical semiconductor materials have a high index of refraction ($n \approx 2.2$-$3.8$) compared to ambient air ($n=1.0$) or encapsulating epoxy ($n \approx 1.5$). According to Snell's law, light traveling from a region having a high index of refraction to a region with a low index of refraction that is within a certain critical angle (relative to the surface normal direction) will cross to the lower index region. Light that reaches the surface beyond the critical angle will not cross but will experience total internal reflection (TIR). The TIR light can continue to be reflected within the LED until it is absorbed, or it can escape out of surfaces other than the emission surface.

Further, the contact electrodes or metal pads disposed on the top surfaces of the doped layers may shield, or in some cases, absorb the light emitted from the active layer. Such internal absorption limits the amount of light that can be extracted from an LED and undesirably reduces the illumination efficiency thereof. Accordingly, there is a need in this industry to provide an improved LED structure that has enhanced brightness and/or efficiency.

SUMMARY OF THE INVENTION

It is one object of the invention to provide an improved LED structure in order to solve the above-mentioned prior art problems and shortcomings.

In one aspect, the invention discloses a light-emitting diode including a substrate; a stacked semiconductor structure on the substrate; at least one contact electrode electrically coupled with the stacked semiconductor structure; and at least one light-guiding structure comprising at least two inclined opposite sidewalls, and the light-guiding structure disposed between the contact electrode and the stacked semiconductor structure, wherein at least part of light emitted from the stacked semiconductor structure can be redirected to escape from at least one of the inclined opposite sidewalls. The stacked semiconductor structure comprises a first layer, an active layer, and a second layer, wherein the active layer is sandwiched between the first layer and the second layer. The light-guiding structure comprises at least one material selected from the group consisting of silicon oxide, silicon nitride, silicon oxynitride, titanium oxide, tantalum oxide, aluminum oxide, or ceramic materials.

In another aspect, the invention discloses a light-emitting diode including a substrate; a stacked semiconductor structure on the substrate, wherein the stacked semiconductor structure comprises an first layer, an active layer, and a second layer, wherein the active layer is sandwiched between the first layer and the second layer; a first contact electrode disposed on the second layer, wherein the first contact electrode comprises a first pad electrode and at least one first finger electrode extending from the first pad electrode; a second contact electrode disposed on the top surface of the first layer within an exposed region, wherein the second contact electrode comprises a second pad electrode and at least one second finger electrode extending from the second pad electrode; at least one light-guiding structure disposed under the first finger electrode; and at least two light-guiding structures separately disposed under the second finger electrode.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

Figure 1:
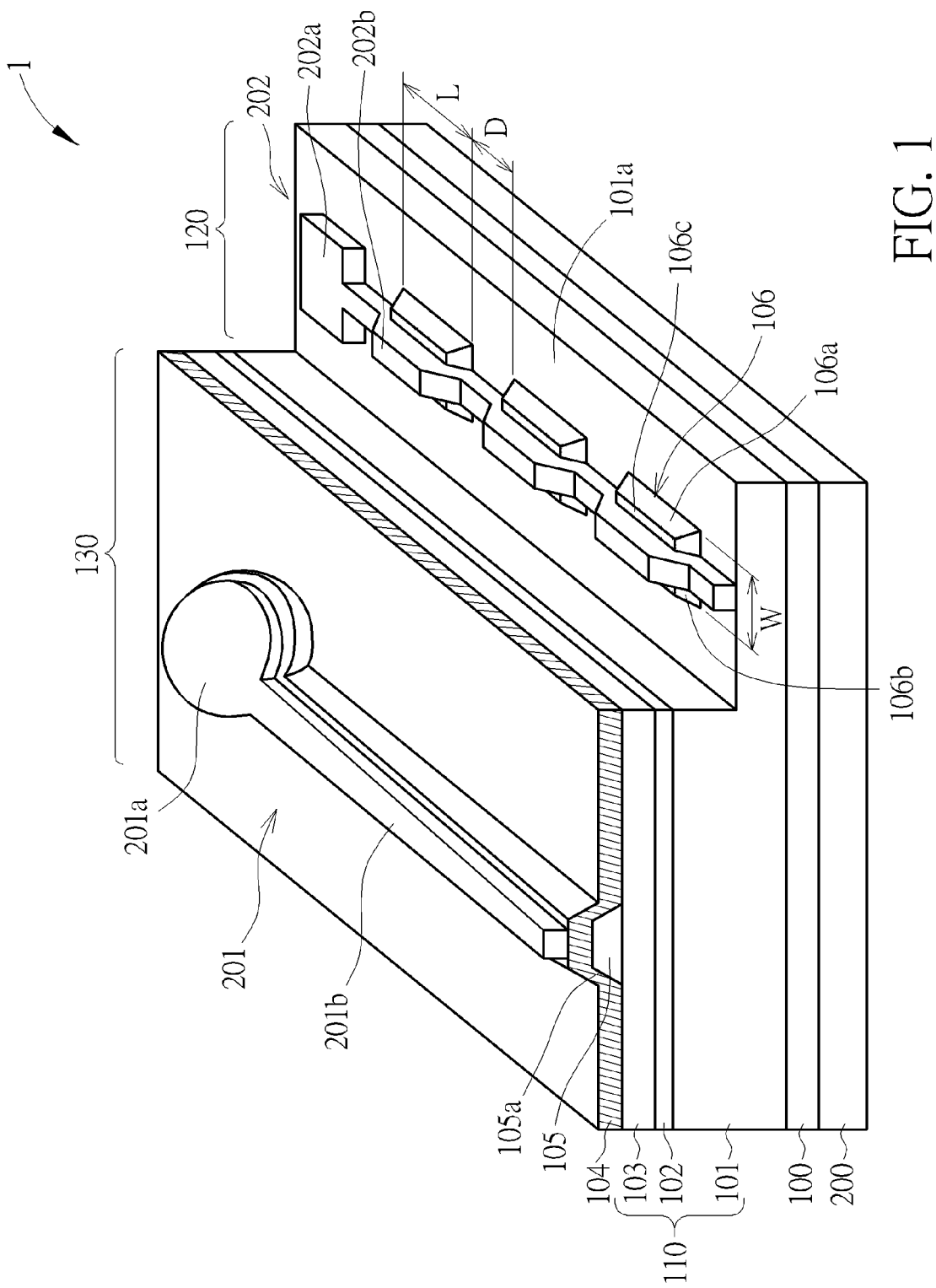
FIG. 1 is a schematic perspective view of a partial cross section of an LED in accordance with one embodiment of this invention.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some structural configurations and process steps are not disclosed in detail, as these should be well-known to those skilled in the art.

Likewise, the drawings showing embodiments of the apparatus are semi-diagrammatic and not to scale and some dimensions are exaggerated in the figures for clarity of presentation. Also, where multiple embodiments are disclosed and described as having some features in common, like or similar features will usually be described with like reference numerals for ease of illustration and description thereof.

FIG. 1 is a schematic perspective view of a partial cross section of an LED in accordance with one of embodiments of this invention. As shown in FIG. 1, an LED 1 includes a substrate 100 such as an optically transparent silicon carbide (SiC) substrate, III-V compound semiconductor substrate or sapphire substrate. A stacked semiconductor structure 110 is disposed on one side of the substrate 100. The stacked semiconductor structure 110 may include but not limited to a first layer 101, an active layer 102, and a second layer 103. The active layer 102 is sandwiched between the first layer 101 and the second layer 103.

A reflection layer 200 may be formed on the other side of the substrate 100 opposite to the stacked semiconductor structure 110. The reflection layer 200 may comprise metallic materials or non-metallic materials such as dielectric materials that provide high reflectivity in order to efficiently reflect light emitted from the active layer 102.

According to the embodiment, the first layer 101 may include but not limited to an N-type doped GaN based layer, and the second layer 101 may include but not limited to a P-type doped GaN based layer. According to the embodiment, the active layer 102 may include but not limited to an undoped indium-gallium-nitride (InGaN) layer or an indium-gallium-nitride (InGaN)/gallium-nitride (GaN) multi-quantum well (MQW) structure.

An exposed region or groove region 120 may be provided in the LED to reveal a portion of the first layer 101. The exposed region 120 is formed by removing at least a portion of the second layer 103, active layer 102, and first layer 101. A mesa region 130 is defined after forming the exposed region 120. Within the mesa region 130, a transparent conductive layer 104 comprising an indium tin oxide (ITO) layer or a graphene layer is provided on the second layer 103.

A first contact electrode 201 is provided on the transparent conductive layer 104 and electrically couples with the stacked semiconductor structure 110 accordingly. According to the embodiment, the first contact electrode 201 may comprise metallic materials including but not limited to chromium (Cr), gold (Au), or combination thereof. The first contact electrode 201 may comprise a pad electrode 201a and at least one finger electrode 201b extending from the pad electrode 201a. A light-guiding structure 105 may be provided under the first contact electrode 201 and corresponding to it. The light-guiding structure 105 is disposed between the transparent conductive layer 104 and the second layer 103. According to the embodiment, the light-guiding structure 105 is a continuous structure having a pattern that substantially conforms to the overlying first contact electrode 201, and a width of the light-guiding structure 105 is greater than a width of the first contact electrode 201.

Figure 2:
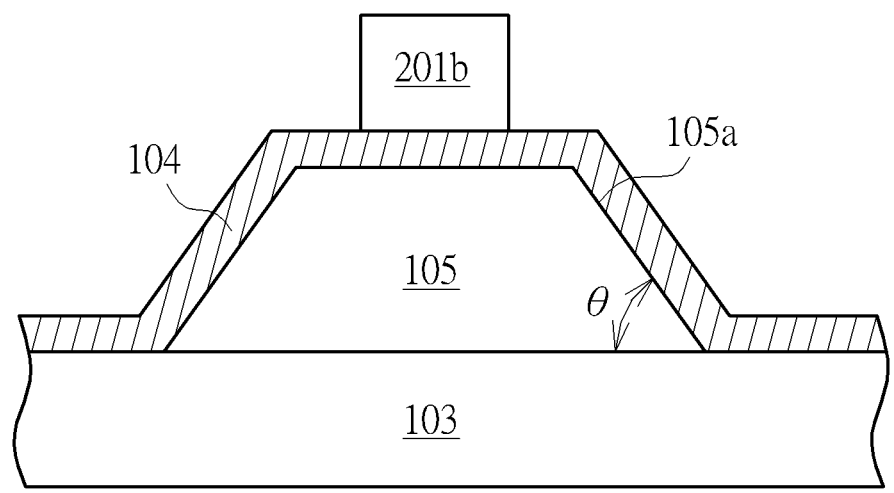
FIG. 2 is a schematic cross-sectional view of the light-guiding structure in FIG. 1.

FIG. 2 is a schematic cross-sectional view of the light-guiding structure 105. As shown in FIG. 2, the light-guiding structure 105 has at least two inclined sidewalls 105a. The inclined sidewalls 105a facilitate the following step of forming the transparent conductive layer 104 and improve the step coverage thereof. According to the embodiment, the base angle θ between one of the sidewalls 105a and the top surface of the second layer 103 is less than 70 degrees, preferably less than 60 degrees, such that the light-guiding structure 105 can perform the improvement as described above and having better light extracting effect. By providing such sidewall profile of the light-guiding structure 105, the thickness of the transparent conductive layer 104 on the sidewall 105a may be substantially equal to the thickness of the transparent conductive layer 104 on the second layer 103, whereby the electrical performance can be improved. According to the embodiment, the light-guiding structure 105 may comprise at least one insulating dielectric material such that light-guiding structure 105 can also perform as a current-blocking structure. Furthermore, the light-guiding structure 105 may comprise at least one material selected from the group consisting of silicon oxide, silicon nitride, silicon oxynitride, titanium oxide, tantalum oxide, aluminum oxide, or ceramic materials.

Referring back to FIG. 1, within the exposed region 120, a second contact electrode 202 is provided on the top surface 101a of the first layer 101 and electrically couples with the stacked semiconductor layer 110 accordingly. According to the embodiment, the second contact electrode 202 may comprise metallic materials including but not limited to Cr, Au, or combination thereof. The second contact electrode 202 may comprise a pad electrode 202a and at least one finger electrode 202b extending from the pad electrode 202a. The finger electrode 202b is arranged substantially in parallel with the first finger electrode 201b.

According to the embodiment, at least two light-guiding structures 106 are separately disposed between the finger electrode 202b and the first layer 101. According to the embodiment, the light-guiding structures 106 may comprise at least one material selected from the group consisting of silicon oxide, silicon nitride, silicon oxynitride, titanium oxide, tantalum oxide, aluminum oxide, or ceramic materials. The light-guiding structures 106 may have a refraction index ranging from 1 to 20 and dielectric constant ranging from 1 to 2000. Each of the light-guiding structures 106 has two inclined opposite sidewalls 106a, two inclined opposite sidewalls 106b, and a substantially flat top surface 106c.

The finger electrode 202b is in direct contact with the inclined opposite sidewalls 106b and the top surface 106c of each light-guiding structure 106. The inclined sidewalls 106b facilitate the following step of forming the finger electrode 202b and improve the step coverage thereof. According to the embodiment, the base angles between the inclined sidewalls 106a/106b and the top surface 101a of the first layer 101 are less than 70 degrees, preferably less than 60 degrees. The base angles of the inclined sidewalls 106a and 106b may be different from each other.

Furthermore, two adjacent light-guiding structures 106 are separated from each other with a distance, which is denoted as dimension D. And at least part of the finger electrode 202b is in direct contact with the top surface 101a of the first layer 101 thereof. According to the embodiment, each of the light-guiding structures 106 has a length L and a width W which is greater than a width of the finger electrode 202b. According to one of preferred embodiments, L shall be greater than D. More specifically, according to another one of preferred embodiments, the range of the ratio of L to D is 1:3 to 3:1 wherein the light extraction efficiency will be improved from 0.5% to over 2.5%.

By providing the light-guiding structures 106 under the finger electrode 202b, at least part of light originally emitted from the active layer 102 can be redirected to a path that does not impinge upon the bottom surface of the finger electrode 202b and then escape from at least one of the inclined opposite sidewalls 106a and 106b of the light-guiding structures 106, wherein the base angles between the inclined sidewalls 106a/106b and the top surface 101a of the first layer 101 are less than 70 degrees, preferably less than 60 degrees, thereby reducing internal absorption and improving the light extraction. The inclined sidewalls 106a and 106b also reduce the possibility of total internal reflection (TIR), which help reflected light escape the surfaces of the LED.

Figure 3A:
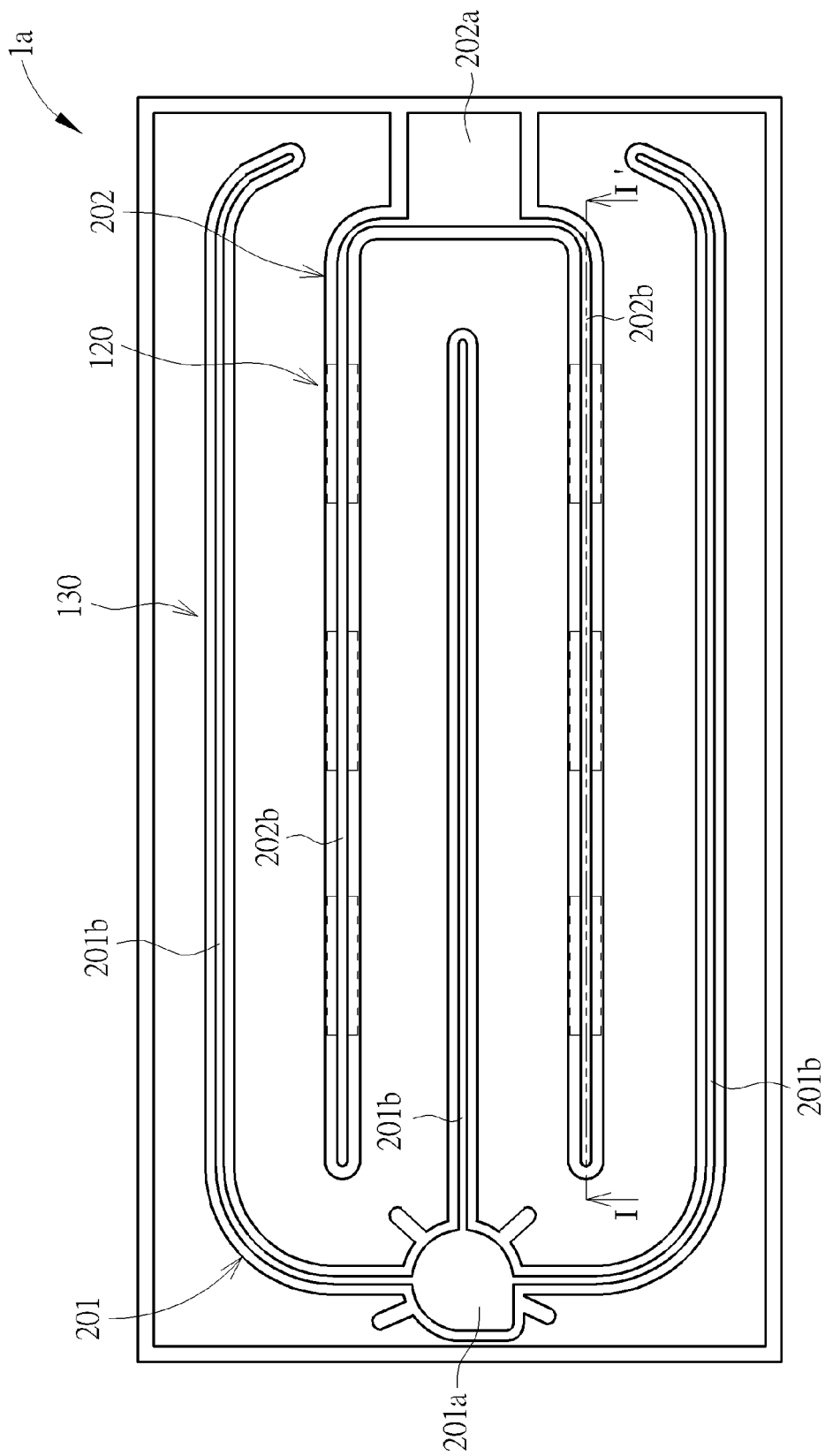
FIG. 3A is an exemplary layout of the contact electrodes on an LED in accordance with another embodiment of this invention.
Figure 3B:
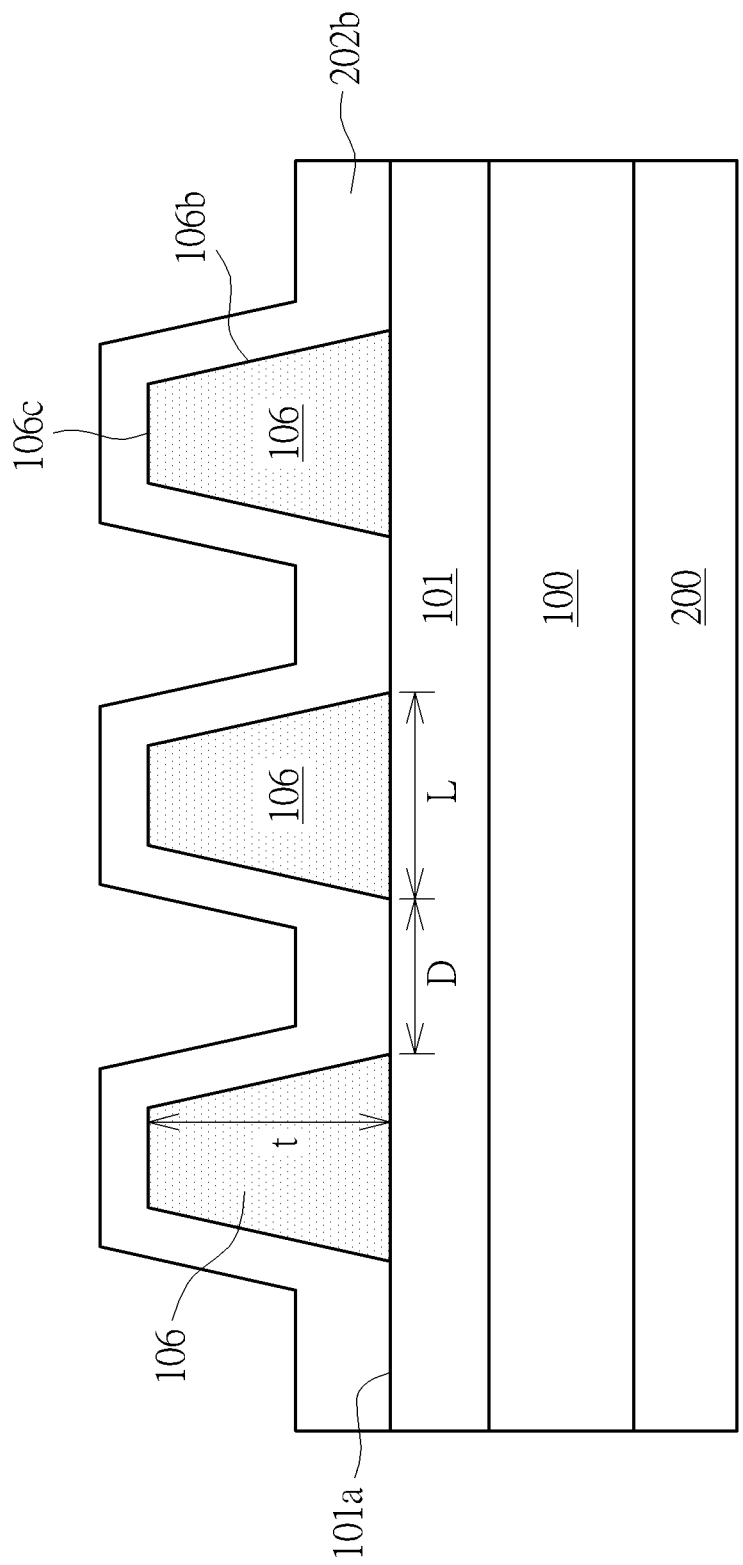
FIG. 3B is a schematic, cross-sectional view taken along line I-I' in FIG. 3A.

FIG. 3A is an exemplary layout of the contact electrodes on an LED in accordance with another one of embodiments of this invention. FIG. 3B is a schematic, cross-sectional view taken along line I-I' in FIG. 3A. As shown in FIGS. 3A and 3B, the LED 1a comprises similar semiconductor structure as described in FIG. 1 including but not limited to a substrate 100, an stacked semiconductor structure 110 on the substrate 100, and a reflection layer 200. Likewise, the stacked semiconductor structure 110 may include but not limited to a first layer 101, an active layer 102, and a second layer 103. According to the embodiment, a first contact electrode 201 within a mesa region 130 comprises a first pad electrode 201a and three first finger electrodes 201b, and a second contact electrode 202 within an exposed region 120 comprises a second pad electrode 202a and two second finger electrodes 202b interdigitated with the first finger electrodes 201b. According to the embodiment, there are three light-guiding structures 106 disposed under each of the second finger electrodes 202b. As previously mentioned, the light-guiding structures 106 are separately disposed directly under the second finger electrodes 202b.

As shown in FIG. 3B, the second finger electrode 202b is in direct contact with inclined opposite sidewalls 106b and a top surface 106c of each light-guiding structure 106. The inclined sidewalls 106b facilitate the step of forming the second finger electrode 202b. According to the embodiment, the base angle between one of the inclined sidewalls 106b and the top surface 101a of the first layer 101 is less than 70 degrees, preferably less than 60 degrees. Likewise, between two adjacent light-guiding structures 106, at least part of the finger electrode 202b is in direct contact with the top surface 101a of the first layer 101, which are denoted as dimension D. According to one of preferred embodiments, the length L of the light-guiding structures 106 is greater than the dimension D. According to another one of preferred embodiments, the range of the ratio of L to D is 1:3 to 3:1 wherein the light extraction efficiency will be improved from 0.5% to over 2.5%. The thickness t of the light-guiding structures 106 may range from 10 to 20000 angstroms, preferably range from 2000 to 8000 angstroms for the blue light emitted from the active layer 102.

Figure 4:
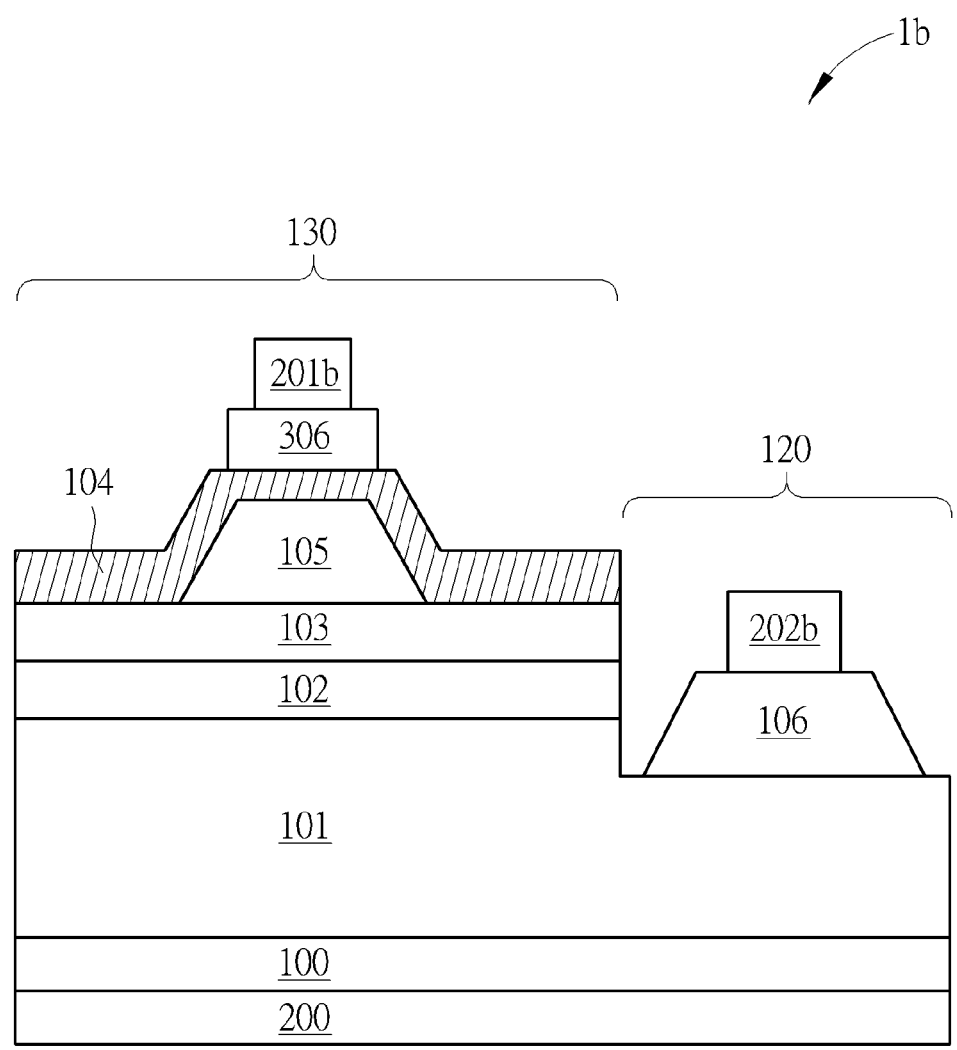
FIG. 4 is a schematic, partial cross-sectional view of an LED in accordance with another embodiment of this invention.

FIG. 4 is a schematic, partial cross-sectional view of an LED in accordance with another one of embodiments of this invention. As shown in FIG. 4, the LED 1b includes a substrate 100 and a stacked semiconductor structure 110 on the substrate 100. The stacked semiconductor structure 110 may include but not limited to a first layer 101, an active layer 102, and a second layer 103. The active layer 102 is sandwiched between the first layer 101 and the second layer 103. A reflection layer 200 may be provided on a bottom side of the substrate 100 opposite to the stacked semiconductor structure 110. The reflection layer 200 may comprise metallic materials or non-metallic materials such as dielectric materials that provide high reflectivity in order to efficiently reflect light emitted from the active layer 102.

According to the embodiment, the first layer 101 may include but not limited to N-type doped GaN based layer, and the second layer 101 may include but not limited to P-type doped GaN based layer. According to the embodiment, the active layer 102 may include but not limited to an undoped indium-gallium-nitride (InGaN) layer or an indium-gallium-nitride (InGaN)/gallium-nitride (GaN) multi-quantum well (MQW) structure.

An exposed region or groove region 120 may be provided in the LED to reveal a portion of the first layer 101. The groove region 120 is formed by removing at least a portion of the second layer 103, active layer 102, and first layer 101. A mesa region 130 is defined after forming the groove region 120. On the second layer 103, a continuous current-blocking structure 105 is provided. Within the mesa region 130, a transparent conductive layer 104 comprising an indium tin oxide (ITO) layer or a graphene layer is provided on the second layer 103 and on the current-blocking structure 105. Within the groove region 120, likewise, light-guiding structures 106 are separately disposed along the finger electrode 202b and are between the finger electrode 202b and the first layer 101.

The difference between the LED 1b and the LED 1 in FIG. 1 is that light-guiding structures 306 are separately disposed along the finger electrode 201b and are between the finger electrode 201b and the transparent conductive layer 104. According to the embodiment, the light-guiding structures 106, 306 and the current-blocking structure 105 may comprise the same material.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A light-emitting diode, comprising:
a substrate;
a stacked semiconductor structure disposed on the substrate, wherein the stacked semiconductor structure comprises a first layer, an active layer, and a second layer, wherein the active layer is sandwiched between the first layer and the second layer;
at least one contact electrode disposed on the stacked semiconductor structure; and
at least one light-guiding structure comprising at least two inclined opposite sidewalls, and the light-guiding structure disposed between the contact electrode and the stacked semiconductor structure, wherein at least part of light emitted from the stacked semiconductor structure can be redirected to escape from at least one of the inclined opposite sidewalls.

2. The light-emitting diode according to claim 1 comprising at least two adjacent light-guiding structures separating from each other with a distance D, and each of the light-guiding structures having a length L, wherein L is greater than D.

3. The light-emitting diode according to claim 1 comprising at least two adjacent light-guiding structures separating from each other with a distance D, and each of the light-guiding structures having a length L, wherein the range of the ratio of L to D is 1:3 to 3:1.

4. The light-emitting diode according to claim 1, wherein the light-guiding structure has a thickness ranging from 10 to 20000 angstroms.

5. The light-emitting diode according to claim 4, wherein the light-guiding structure has a thickness ranging from 2000 to 8000 angstroms.

6. The light-emitting diode according to claim 1, wherein a base angle between one of the inclined sidewalls of the light-guiding structure and a top surface of the stacked semiconductor structure is less than 70 degrees.

7. The light-emitting diode according to claim 1, wherein the light-guiding structure has a width which is greater than a width of the contact electrode.

8. The light-emitting diode according to claim 1, wherein the contact electrode comprises a pad electrode and at least one finger electrode extending from the pad electrode, and wherein the light-guiding structure is disposed between the finger electrode and the first layer.

9. The light-emitting diode according to claim 8, wherein the light-guiding structure has a width which is greater than a width of the finger electrode.

10. The light-emitting diode according to claim 8, wherein the number of the light-guiding structure is more than one, at least two of the adjacent light-guiding structures are separated from each other with a distance D, and each of the light-guiding structures has a length L, and wherein L is greater than D.

11. The light-emitting diode according to claim 8, wherein the number of the light-guiding structure is more than one, at least two of the adjacent light-guiding structures are separated from each other with a distance D, and each of the light-guiding structures has a length L, and wherein the range of the ratio of L to D is 1:3 to 3:1.

12. The light-emitting diode according to claim 1, wherein the light-guiding structure comprises at least one material selected from the group consisting of silicon oxide, silicon nitride, silicon oxynitride, titanium oxide, tantalum oxide, aluminum oxide, or ceramic materials.

13. The light-emitting diode according to claim 1, wherein the light-guiding structure has a refraction index ranging from 1 to 20.

14. The light-emitting diode according to claim 1, wherein the light-guiding structure has a dielectric constant ranging from 1 to 2000.

15. A light-emitting diode, comprising:
a substrate;
an stacked semiconductor structure on the substrate, wherein the stacked semiconductor structure comprises a first layer, an active layer, and a second layer, wherein the active layer is sandwiched between the first layer and the second layer;
a first contact electrode disposed on the second layer, wherein the first contact electrode comprising a first pad electrode and at least one first finger electrode extending from the first pad electrode;
a second contact electrode disposed on a top surface of the first layer within an exposed region, wherein the second contact electrode comprising a second pad electrode and at least one second finger electrode extending from the second pad electrode;
at least one light-guiding structure disposed under the first finger electrode; and
a least two light-guiding structures separately disposed under the second finger electrode.

16. The light-emitting diode according to claim 15, wherein at least two of the adjacent the light-guiding structures disposed under the second finger electrode are separated from each other with a distance D, and each of the light-guiding structures disposed under the second finger electrode has a length L, and wherein L is greater than D.

17. The light-emitting diode according to claim 15, wherein at least two of the adjacent the light-guiding structures disposed under the second finger electrode are separated from each other with a distance D, and each of the light-guiding structures disposed under the second finger electrode has a length L, and wherein the range of the ratio of L to D is 1:3 to 3:1.

18. The light-emitting diode according to claim 15, wherein the light-guiding structure disposed under the first finger electrode of the first contact electrode is a continuous structure having a pattern that substantially conforms to the overlying first contact electrode.

19. The light-emitting diode according to claim 15, wherein a width of the light-guiding structure disposed under the first finger electrode of the first contact electrode is greater than a width of the first contact electrode.

* * * * *